US011304304B2

(12) United States Patent
Cai et al.

(10) Patent No.: US 11,304,304 B2
(45) Date of Patent: Apr. 12, 2022

(54) IONIC CONTAMINANT CLEANING

(71) Applicant: International Business Machines Corporation, Armonk, NY (US)

(72) Inventors: Vincent Y C Cai, Zhong shan (CN); Hui Xing Wang, Shenzhen (CN); Djanie He, Shenzhen (CN); Joan Huang, Shenzhen (CN)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 16/679,657

(22) Filed: Nov. 11, 2019

(65) Prior Publication Data
US 2021/0144862 A1    May 13, 2021

(51) Int. Cl.
*B08B 3/10* (2006.01)
*H05K 3/26* (2006.01)

(52) U.S. Cl.
CPC .............. *H05K 3/26* (2013.01); *B08B 3/10* (2013.01); *H05K 2203/0783* (2013.01)

(58) Field of Classification Search
CPC .... H05K 3/26; H05K 2203/0783; B08B 3/10; B08B 3/02
See application file for complete search history.

(56) References Cited

U.S. PATENT DOCUMENTS

| 4,731,154 A | 3/1988 | Hausman Hazlitt et al. |
| 4,996,160 A | 2/1991 | Hausman Hazlitt et al. |
| 5,421,906 A | 6/1995 | Borah |
| 5,908,556 A | 6/1999 | Cavotta et al. |
| 10,750,619 B2 * | 8/2020 | Yen ..................... C23C 18/1893 |
| 2005/0045205 A1 | 3/2005 | Stach |
| 2008/0200360 A1 | 8/2008 | Beck et al. |
| 2012/0141799 A1 | 6/2012 | Kub et al. |
| 2016/0038885 A1 | 2/2016 | Hogen-Esch et al. |
| 2016/0339160 A1 | 11/2016 | Bedworth et al. |
| 2016/0349905 A1 * | 12/2016 | Momma ............... G06F 3/0445 |
| 2018/0056422 A1 * | 3/2018 | Kim ..................... B23K 1/203 |
| 2018/0368266 A1 * | 12/2018 | Yeh ...................... H05K 3/424 |
| 2019/0136159 A1 | 5/2019 | Doyel et al. |

FOREIGN PATENT DOCUMENTS

| CN | 104815608 A | 8/2015 |
| CN | 105658574 A | 6/2016 |
| CN | 106686904 A | 5/2017 |
| CN | 104845768 B | 12/2017 |
| CN | 108080033 A | 5/2018 |

(Continued)

OTHER PUBLICATIONS

Abstarct of CN 110351956A. (Year: 2019).*

(Continued)

*Primary Examiner* — Alexander Markoff
(74) *Attorney, Agent, or Firm* — Jared C. Chaney

(57) ABSTRACT

Aspects of the present disclosure relate to dispersing graphene oxide in a fluid and washing a first electronic part with cleaning fluid. Aspects of the present disclosure relate to testing cleaning fluid for a concentration of ions, and determining whether the ion concentration is below a threshold. If the ion concentration is below a threshold level, continuing to wash parts with the fluid. If the ion concentration is above a threshold level, replacing the cleaning fluid.

10 Claims, 7 Drawing Sheets

(56) References Cited

FOREIGN PATENT DOCUMENTS

| | | | |
|---|---|---|---|
| JP | 2011027563 A | 2/2011 | |
| JP | 2016222526 A * | 12/2016 | ......... G02F 1/13439 |
| KR | 101476157 B1 | 12/2014 | |
| WO | 2015157280 A1 | 10/2015 | |
| WO | WO-2020258930 A1 * | 12/2020 | .............. B01J 20/20 |

OTHER PUBLICATIONS

Abstarct of CN 110759335A. (Year: 2020).*
Abstarct of CN 102915854A. (Year: 2013).*
Abstarct of CN 108332887A. (Year: 2018).*
Abstarct of CN 112055509A. (Year: 2020).*
Abstarct of CN 201310723398A. (Year: 2014).*
Mukherjee, "Cleaning Process Development and Optimization in the Surface Mount Assembly Line of Power Modules," Thesis Submitted to the Department of Mechanical Engineering in Partial Fulfillment of the Requirements for the Degree of, Master of Engineering in Manufacturing, Sep. 2011, 84 pages.
Mell et al., "The NIST Definition of Cloud Computing," Recommendations of the National Institute of Standards and Technology, U.S. Department of Commerce, Special Publication 800-145, Sep. 2011, 7 pages.

* cited by examiner

IONIC CONTAMINANT CLEANING

BACKGROUND

Aspects of the present disclosure relate to printed circuit boards (PCB), more particular aspects relate to PCB cleaning with a fluid solution.

Printed Circuit Board (PCB) fabrication is the assembly method for circuit boards used in electronic and computer devices. The layers of the board are put together along with the specific surface pattern so it can be used in electronics manufacturing.

BRIEF SUMMARY

The present disclosure provides a method of ionic contaminant cleaning. In some embodiments, the method includes dispersing a first quantity of graphene oxide in a fluid to form a cleaning fluid, washing a first electronic part with the cleaning fluid, testing the cleaning fluid for a concentration of ions, and determining the ion concentration is above a threshold.

In some embodiments, the method includes washing a first electronic part with cleaning fluid, testing the cleaning fluid for a concentration of ions, and determining whether the ion concentration is below a threshold.

In some embodiments, the method includes dispersing graphene oxide in a fluid, and washing an electronic part with the fluid.

DETAILED DESCRIPTION

Figure 1:
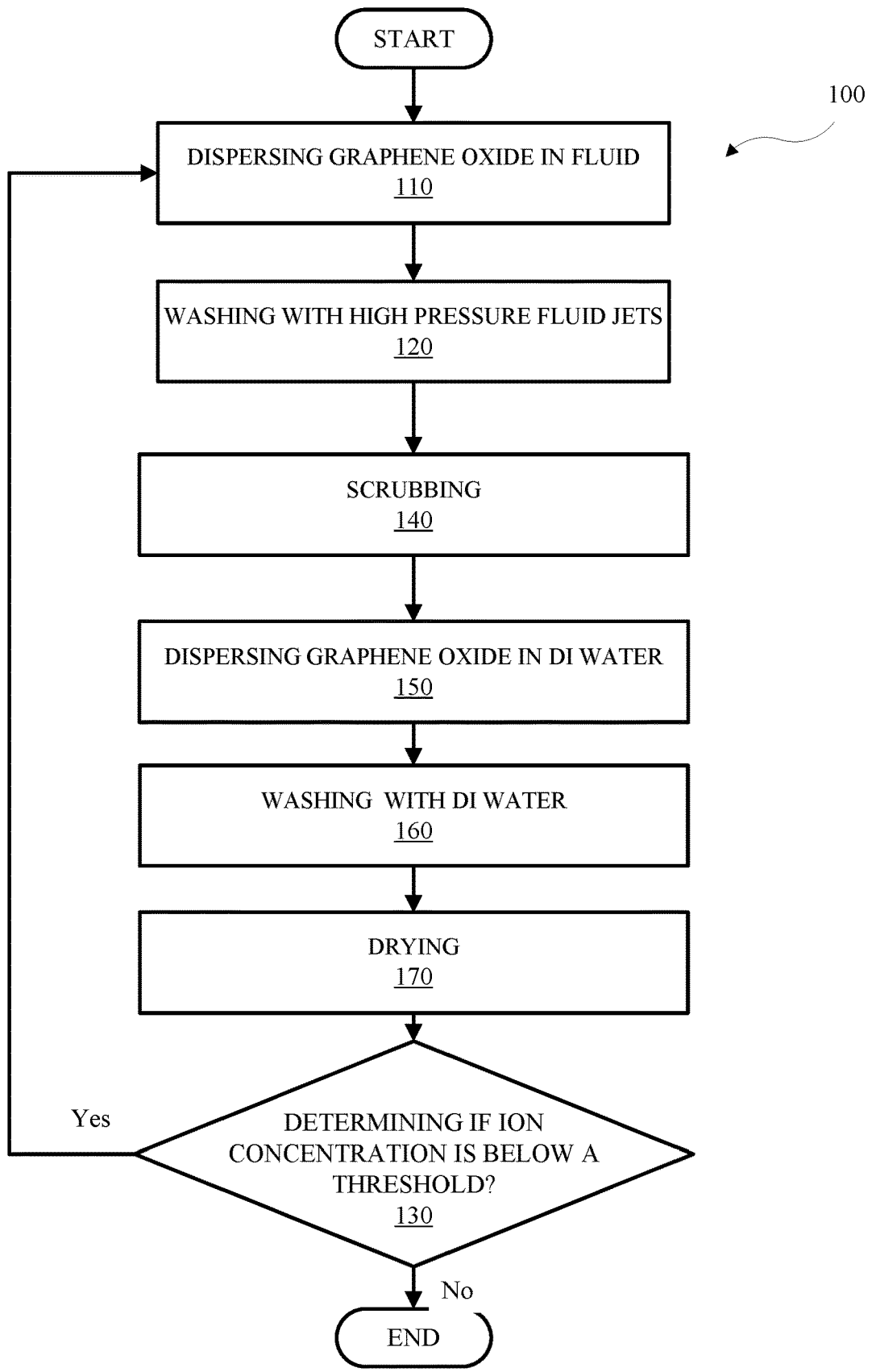
FIG. 1 depicts a block diagram of an example cleaning process for an electronic component according to various embodiments of the present invention.

Electronic components such as printed circuit boards (PCBs) and integrated circuits require cleaning during manufacture. For example, water-soluble flux is often used in printed circuit board manufacturing. Water-soluble flux remains corrosive after use and leaves ions that can lead to shorts month or even years after fabrication. For example, S04, N03, and cl-ions can be of particular concern.

Typically, electronic components, such as PCBs, are put through a cleaning process to remove residual flux, ions, and other unwanted contaminants. Often aggressive cleaning techniques such as micro-etching and ultrasonic water washing are used to remove residual flux. However, these aggressive cleaning techniques can damage or degrade the PCBs.

An example industrial cleaning process may involve micro-etching, high pressure water washing, scrubbing, ultrasonic water washing, deionized (DI) water washing, drying, and testing of parts. However, some of these steps have the potential to damage or degrade the electronic components. For example, micro etching is a chemical etching process that selectively dissolves metal from the surface of a PCB. Although micro etching can remove contaminant ions and clean oxidation off the surface, it also removes some desired material in the process, creating defects in a PCB that can lead to potential problems.

Ultrasonic cleaning machines use high frequencies to cause cavitation: the violent implosion of billions of minute bubbles in the cleaning solution contained in an ultrasonic cleaner tank. The bubbles are created by transducers bonded to the bottom of the tank and excited to ultrasonic frequencies by generators. This process can cause or exacerbate micro cracks in electronic components.

The cleaning water used to clean the electronic parts is periodically replaced based on quality control tests performed after PCBs have been cleaned. Quality control during the PCB cleaning process is often performed by taking a sampling of parts and using an ionograph, or another ion detecting device, to check the level of ion contamination on a part. If the parts pass, they are sent on down the assembly line. However, if the parts fail, the water must be replaced and all the parts that have gone through the system since the last board passed must be put through the cleaning system again. Not being able to evaluate the efficacy of a cleaning solution during processing causes significant assembly delays.

An ionograph is a system to measure the level of contamination of the surfaces of printed circuit boards by immersing a PCB in a vessel containing a rinsing fluid, which is being continuously circulated.

Often defects in electronic components, such as PCB parts, do not materialize until months or years after the PCBs are fabricated. Small defects, such as metallic filaments called dendrites (also referred to herein as "dendritic growths"), can form over time and cause defects or failures in the PCB. Ionic contamination happens when ionic residues that interfere with reliability and functionality remain on a complete PCB. An ionic residue contains atoms or molecules that become conductive when in a solution. Exposure to moisture makes ionic residues disassociate into negatively or positively charged elements, changing the solution's overall conductivity.

A PCB can also have nonionic contamination, which involves nonionic residues. Nonionic residues don't have conductive properties, so they can usually remain on the PCB after production and assembly. Therefore, most manufacturers focus on ionic contamination when examining a board's cleanliness. The ionic residues that affect PCB components during production include; salts, inorganic and organic acids, ethanolamines, perspiration, flux activators, and plating chemistries.

Ionic contamination has two common sources, lack of bare board cleanliness and use of aggressive chemistry. Lack of bare board cleanliness: Many ionic contaminants come from the board itself. The board fabrication process, as well as environmental exposure, can leave residues such as particulate residues, oils, salts and dust. Before adding components to a bare board, manufacturers should ensure no contaminants were left over from previous steps in the production process. Use of aggressive chemistry: Copper etching liquid, water-soluble soldering chemistry and other kinds of aggressive chemistry can leave behind residues that change the board's conductivity when not cleaned properly.

Failure to remove excess ionic residues can result in corrosion, dendritic growth, and Electrochemical migration.

Most PCBs will corrode eventually due to their metal materials. However, ionic contamination can result in a much shorter time until corrosion compared to the PCB's expected lifespan. Corrosion refers to the process of oxygen bonding to metal and creating rust. When moisture comes in contact with ionic residue, the risk of short-circuiting increases. The corroding metal flakes off, losing the chemical properties needed for the PCB to operate correctly.

During dendritic growth, conductive metal slivers, or dendrites, grow on a PCB through an electrolytic solution influenced by a DC voltage bias. Dendrites can appear quickly when the pores in a solder mask retain flux or another ionic residue. When dendrites come in contact with each other, defects such as short-circuiting and intermittent operation can arise.

Electrochemical migration also involves dendrites. Since dendrites form from conductive ions, they can direct currents differently from the PCB's intended design. Dendritic growth causes electrochemical migration, which creates total or intermittent failures. Dendritic growth and electrochemical migration are closely related to each other and tend to happen simultaneously.

Although PCBs are used as an example, similar problems can exist in other electronic components. Therefore, the embodiments presented here can be applicable to a variety of electronic components.

In some embodiments, graphene oxide (GO) powder is dispersed in electronic washing fluid (e.g., water or deionized water) to facilitate the removal of ions from the surface of electronic components. GO is a two-dimensional nanomaterial featuring a variety of chemically reactive functionalities, such as carboxyl, hydroxyl and epoxy at the edges and on the plane of GO sheets (two-dimensional monolayers of carbon atoms which are tightly packed into a hexagonal lattice), which can be differentially functionalized. In some embodiments, the GO attracts ions on the surface of electronic components thereby removing them from the surface and dispersing the ions in the fluid.

In some embodiments, the GO powder may have a purity of 95-99 wt %. In some embodiments, the average particle size may range from 1-5 µm. In some embodiments, the GO powder may be added to the cleaning fluid such that the cleaning fluid is 1-3 wt % GO. In some embodiments, the potential hydrogen (pH) of the cleaning fluid may be adjusted to be approximately 7. For example, a pH of approximately 7 may range from a pH of 6 to a pH of 8. In some embodiments, the temperature of the cleaning fluid may be adjusted to be within 5° of 45° C. In some embodiments, the parts may spend 15 to 20 minutes in the washing system.

FIG. 1 depicts a block diagram of an example cleaning process 100 for an electronic component.

In block 110, the GO is dispersed in the washing fluid. In some embodiments, the dispersion of GO is facilitated by at least one of: ultrasonic agitation, mixing, stirring, and milling.

In block 120, the PCBs may be sprayed with one or more high-pressure jets of the washing fluid. In some embodiments, multiple jets may be sprayed on the part. In some embodiments, one jet may be moved over the surface of the PCB. The high-pressure jets allow the washing fluid to dislodge ion particles present on the PCB and allow the washing fluid to penetrate narrow cracks and crevices.

In block 140, the PCB is scrubbed to dislodge ion particles. In some embodiments, pumice scrubbing or brush scrubbing is used as the scrubbing method. Pumice scrubbing is spraying the surface of the PCB with abrasive pumice particles dispersed in a fluid solution. Brush scrubbing uses an abrasive brush to dislodge surface particles.

In block 150, GO is dispersed in deionized (DI) water for DI washing. The DI washing occurs in block 160. In some embodiments, the DI water washing is used to remove residual cleaning fluid from the surface of the PCB. In some embodiments, the DI water washing is used to remove loose ions that have settle onto the PCB from the washing water.

In block 130, the ion concentration of the DI water is tested. In some embodiments, after a certain number of parts have passed through a cleaning system with fresh water, the water may be tested. In some embodiments, IPC-TM650 2.3.25 guidelines may be used to test the ion concentration of the water. The industry standard for ion contaminations analysis is IPC-TM-650 Method 2.3.25—Detection and Measurement of Ionizable Surface Contaminants by Resistivity of Solvent Extract (ROSE).

In block 170, the PCB is dried. In some embodiments, the PCB is oven dried. In some embodiments, filtered air is blown over the PCB.

In block 130, the PCB is tested for ion concentration on the surface. In some embodiments, the testing may be a sampling of the PCB parts that have been processed through the system.

In some embodiments, one or more steps may be reordered. In some embodiments, one or more blocks may be omitted. In some embodiments, one or more blocks may be substituted for a similar block. For example, if two high pressure washings are found to be just as effective as one high pressure washing and one scrubbing, high pressure washing may be performed twice.

Figure 2:
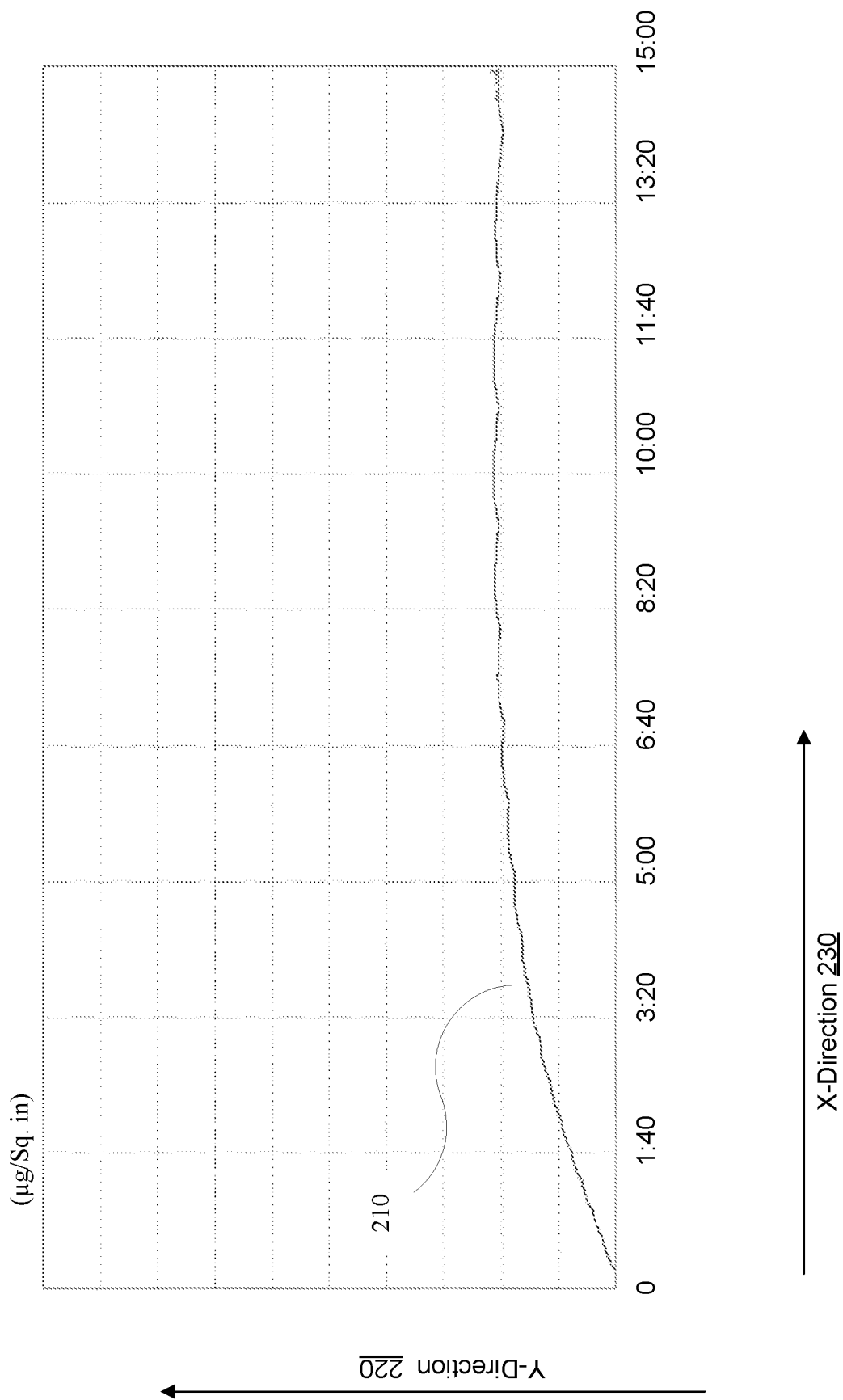
FIG. 2 depicts a graph illustrating the ion concentration of cleaning fluid during the cleaning of a PCB.

FIG. 2 depicts a graph illustrating the ion concentration of cleaning fluid during the cleaning of a PCB. Some laboratory studies have shown that, in some embodiments, graphene oxide dispersed in water facilitates the removal of ions from the surface of a PCB. Referring to FIG. 2, Line 210 shows the concentration of ions in GO dispersed water during washing. Axis 220 is the concentration of ions in the water, and axis 230 is time. With conventional water washing, the slope is more linear. However, with GO dispersed water, the slope decreases quickly (indicating fewer ions are being dispersed in the water) because the ion particles are cleaned off the board more quickly.

In some embodiments, the washing fluid and/or the DI water may be sampled periodically during washing to determine if the ion concentration is beyond a threshold that dictates when the washing fluid and/or the DI water may require replacement. In some embodiments, the threshold is determined by an effectiveness of the washing fluid and/or the DI water. In some embodiments, a threshold may be determined based on a passage rate of boards verses the ion concentration of the water. For example, if 98% of boards pass when cleaned with water having an ion concentration below 1 µg/sq in and 95% of boards pass when cleaned with water having an ion concentration above 1 µg/sq in, then 1 µg/sq in may be chosen as the threshold.

Figure 3:
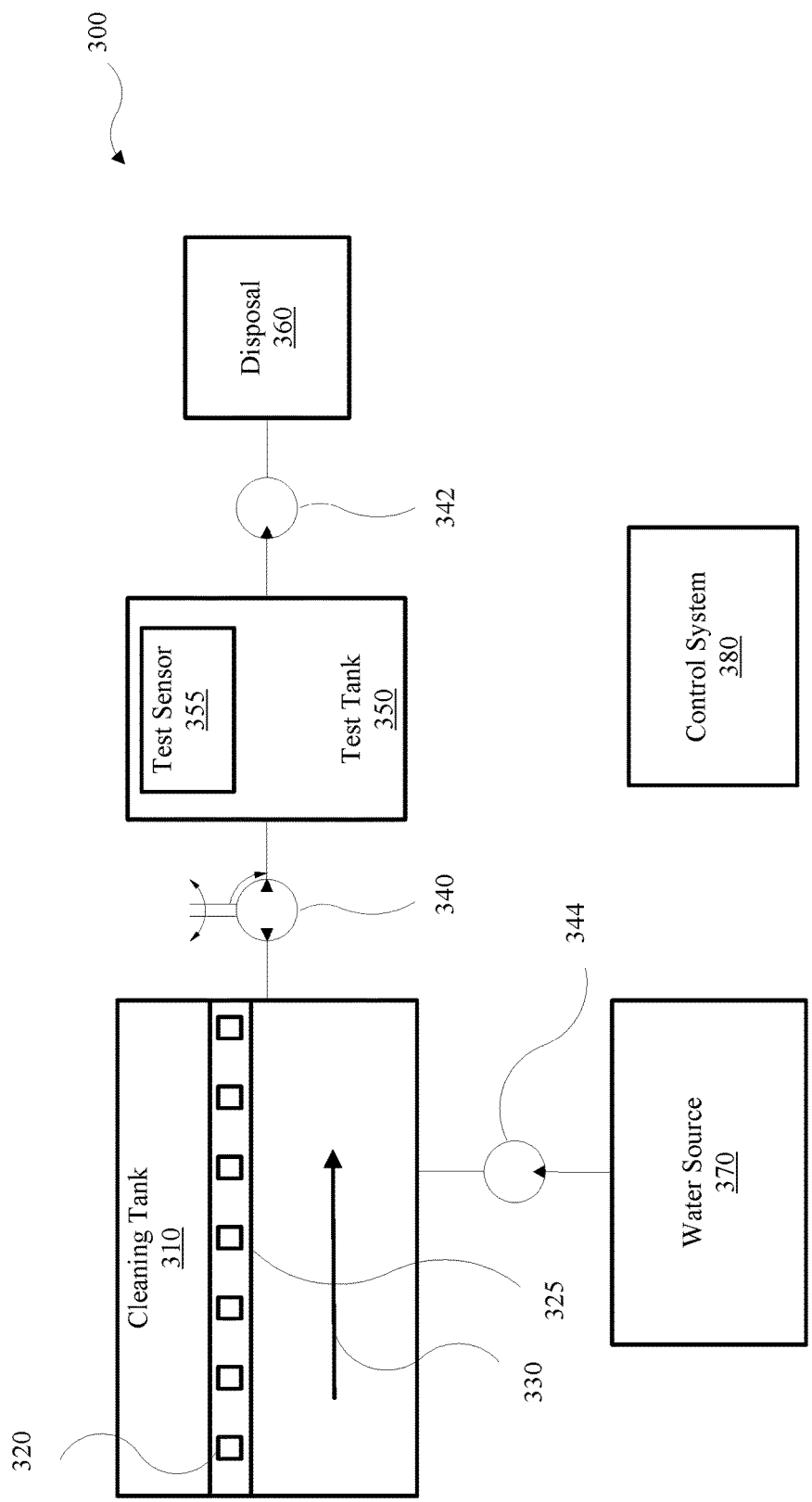
FIG. 3 illustrates an example diagram of a PCB cleaning system, according to various embodiments of the present invention.

FIG. 3 shows an example diagram of a PCB cleaning system. In some embodiments the PCB cleaning system may include a cleaning tank 310, one or more PCBs 320, a conveyor belt 325 to move PCBs 320 in direction 330, a two way pump 340, one way pumps 342 and 344, a test tank 350, a test sensor 355, a disposal 360, a water source 370, and a control system 380 to control test sensor 355 and pumps

340, 342, and 344. Parts in this example are not exhaustive. In some embodiments, cleaning tank 310 may be multiple cleaning tanks (for example, a first tank may use regular cleaning water or fluid and a second tank may use DI water only). Likewise, for example, pumps 340, 342, and 344 may be one pump and the flow may be controlled with valves. In some embodiments, various other sensors may be used to detect flow of fluid through the system. For example, pressure sensors may be near pumps 340, 342, and 344, and may be used to determine a flow of fluid through pumps 340, 342, and 344. Other methods of detecting fluids may also be used. For example, a volume measurement of cleaning tank 310 may be used to determine how much fluid pump 340 has removed to test tank 350. In some embodiments, the ion concentration testing may be done directly in the cleaning tank 310 and cleaning tank 310 and test tank 350 may be the same tank. In some embodiments, test tank 350 may be in cleaning tank 310.

In some embodiments, multiple PCBs may be run through cleaning tank 310 along conveyor belt 325 (or another movement system) in direction 330. In some embodiments, fluid in cleaning tank 310 may be periodically tested. In some embodiments, the rate of testing may depend on the likelihood of the ion concentration being over a limit. In some aspects, the water may be tested less frequently when the cleaning fluid has just been replaced and is replaced more frequently as the concentration of ions in the fluid approaches the threshold.

In some embodiments, pump 340 may draw off a small about of the cleaning fluid (cleaning fluid sample) from cleaning tank 310 into test tank 350. In some embodiments, test sensor 355 may be used to determine the ion concentration of the cleaning fluid sample.

In some embodiments, when the ion concentration of the fluid is determined to be below the threshold, pump 340 may return the fluid to cleaning tank 310. In some embodiments, after testing, the cleaning fluid sample may be disposed of regardless of the outcome.

In some embodiments, when the cleaning fluid sample is found to be above a threshold, pump 340 and 342 may move some or all the cleaning fluid in cleaning tank 310 and test tank 350 to disposal 360. In some embodiments, disposal 360 may be a holding tank, a drain, or a purification device. In some embodiments, pump 344 may move cleaning fluid from cleaning fluid source 370 to cleaning tank 310. In some embodiments, all the cleaning fluid in cleaning tank 310 may be replaced. In some embodiments, a partial replacement of cleaning fluid may be performed to bring the ion concentration below a certain predetermined level. In some embodiments, the predetermined level may be chosen based on the expected number of parts that will be able to be cleaned before the fluid is at the threshold again. For example, if the line shuts down every weekend, the predetermined level may be set so the fluid will effectively clean parts until the weekend. In some aspects, a partial replacement (e.g., replacement of a 20% portion of the cleaning fluid) may be performed to prevent a halt to cleaning in cleaning tank 310 that may be required for a complete replacement of the cleaning fluid. In some embodiments, fluid from cleaning tank 310 may be disposed of directly without first going to test tank 350. For example, cleaning tank 310 may have a drain attached.

In some embodiments, control system 380 may use the ion concentration of the cleaning fluid to determine the cleaning time for each part. For example, a part cleaned with fresh cleaning fluid may be able to be processed in cleaning tank 310 for 10 minutes. However, once the ion concentration reaches 1 µg/sq in in the cleaning fluid the parts may need to be processed for 20 minutes to achieve the same cleaning results as fresh cleaning fluid. In some embodiments, control system 380 is a computer system used to control the cleaning system. In some embodiments, control system 380 includes a multipoint control unit, a general packet radio services unit, a modulation-demodulation unit, a rive circuit, an amplifying circuit, a power source, and a connections to one or more sensors.

Figure 4:
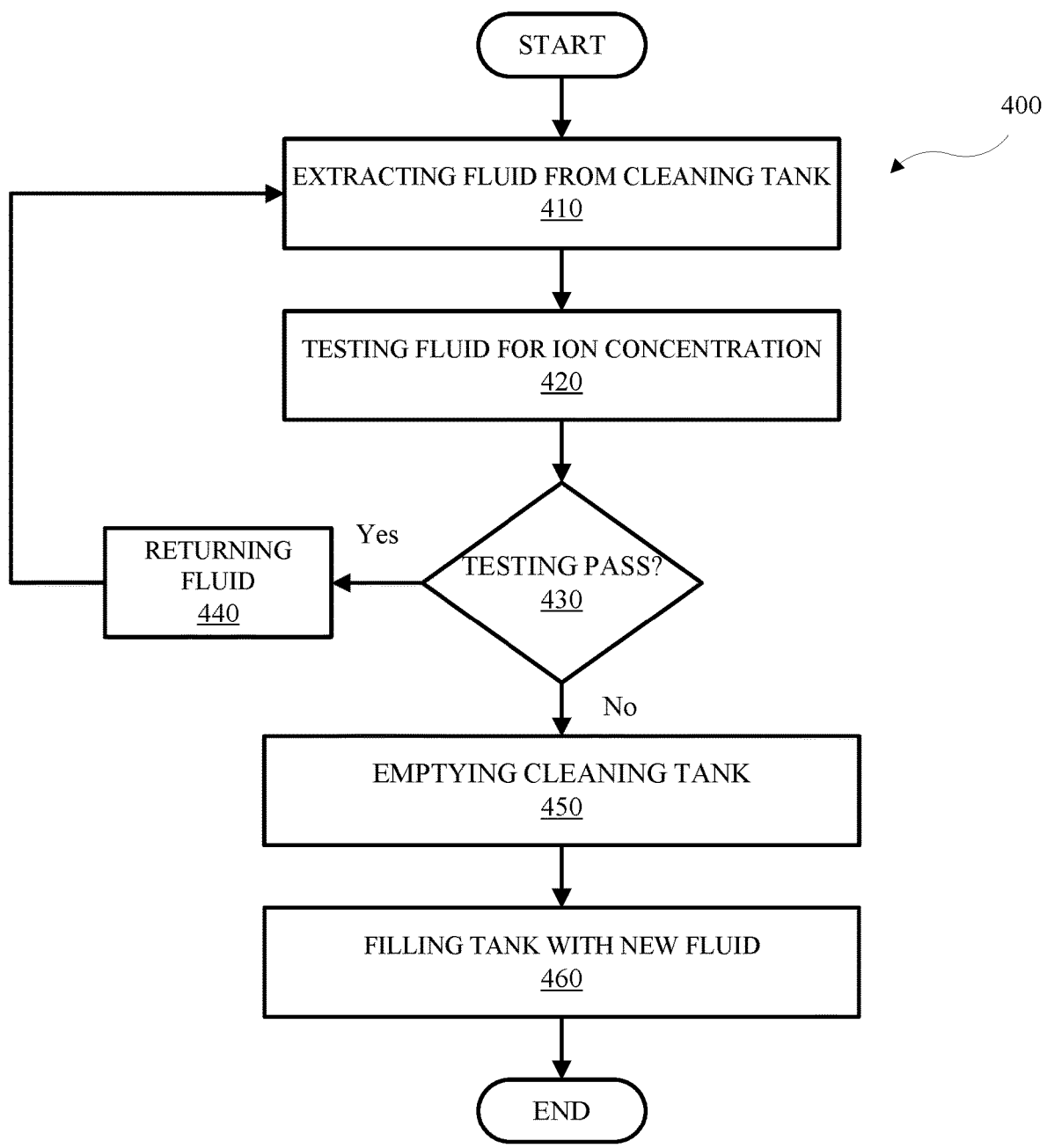
FIG. 4 illustrates an example block diagram describing showing a method of testing the ion concentration of cleaning fluid in a cleaning tank, according to various embodiments of the present invention.

FIG. 4 is an example block diagram describing showing a method of testing the ion concentration of cleaning fluid in a cleaning tank. In block 410, a sample of the cleaning fluid is removed from a cleaning tank and placed in a testing tank.

In block 420, the ion concentration of the fluid is tested. For example, measurement using the R.O.S.E. test relies on dissolving the ionic residues that are bound in an organic flux matrix, to measure the effect on resistivity.

In block 430, it may be determined whether the cleaning fluid surpasses an ion concentration threshold.

In block 440, if the cleaning fluid is below a threshold, the sample may be returned to the cleaning tank and block 410 may be repeated. While method 400 includes returning fluid to the cleaning tank, in some embodiments of the present disclosure, a method of testing the ion concentration may not return the fluid, but may dispose of it. In some embodiments, the sampling may be a flow of sample fluid that is continuously tested. For example, the cleaning fluid may be continuously pumped into and out of the test tank and the fluid may be tested every minute. In some alternative embodiments (not shown in FIG. 4), the testing may happen directly in the cleaning tank, so a sample of fluid may not need to be taken and returned.

In block 450, if the cleaning fluid is above a threshold ion concentration level, the cleaning tank may be emptied, and the cleaning fluid may be disposed of. In some embodiments, all the fluid in the tank may be removed. In some embodiments, the controller may set a flow rate of fluid in and out (i.e., a replacement rate) of the cleaning tank based on the ion concentration of the fluid. The controller may determine a how much fluid must be taken out and how much fluid must be returned in a period of time (e.g., every minute), during the cleaning process, to keep the ion concentration of the cleaning fluid below a certain level. For example, when all the fluid has been replaced, the flow rate may be set at 0%, but during typical operation, the flow rate may be 5% per hour.

In block 460, the cleaning tank may be refilled with fresh cleaning fluid. In some embodiments, the tank may be completely refilled. In some embodiments, the majority of the cleaning fluid may be replaced when the concentration surpasses the threshold. For example, more than 95% of the fluid may be replaced. In some embodiments, a small percentage of the cleaning fluid may be replaced to bring the ion concentration of the cleaning fluid under the threshold. For example, 25% of the fluid may be replaced when the ion concentration meets or exceeds a threshold.

Figure 5:
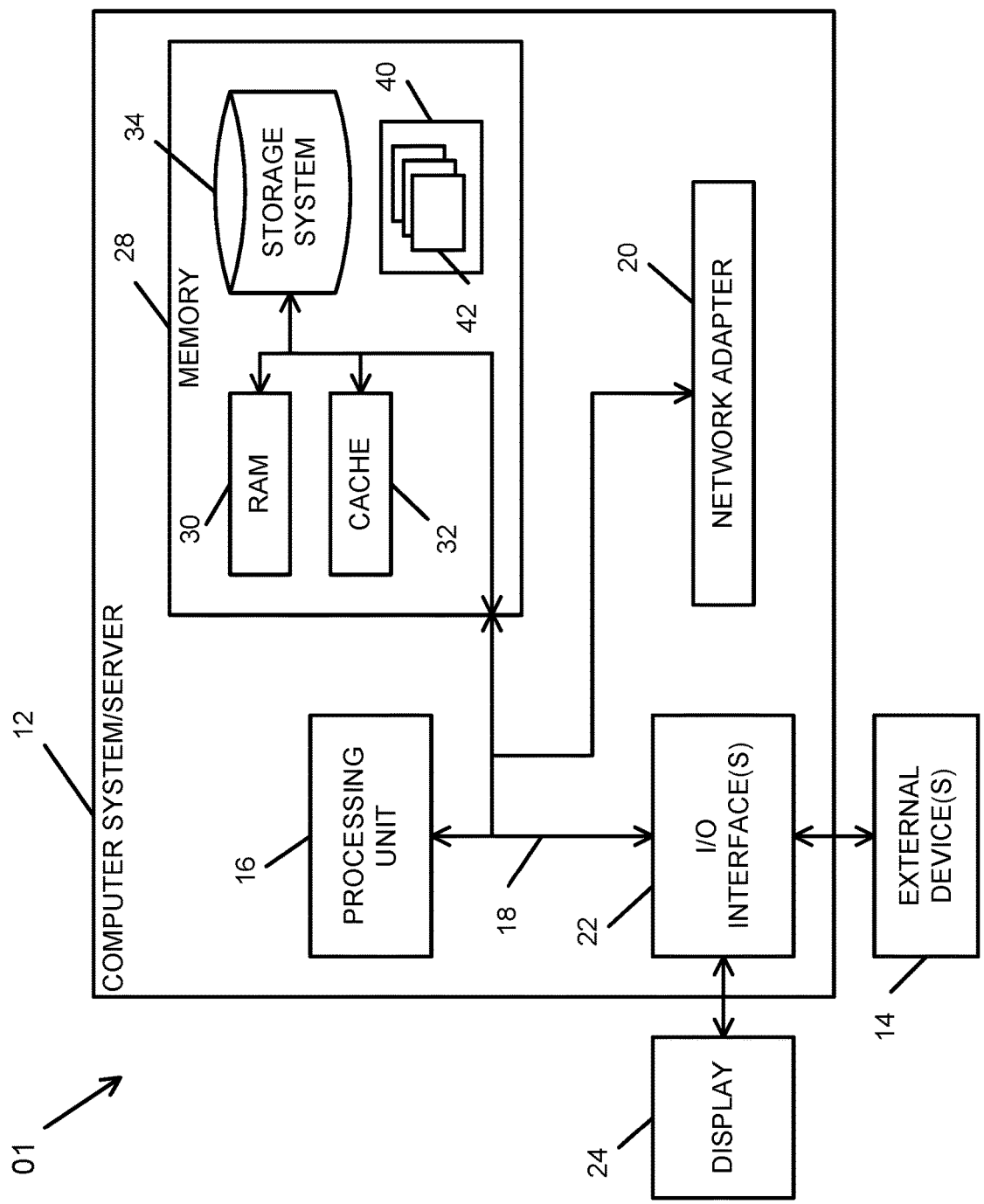
FIG. 5 depicts a computer system according to various embodiments of the present invention.

In an example embodiment, the above methods may be performed by aa controller, which may take the form of a computer system such as computer system 01, shown in FIG. 5. Computer system 01 is only one example of a computer system and is not intended to suggest any limitation as to the scope of use or functionality of embodiments of the present invention. Regardless, computer system 01 is capable of being implemented to perform and/or performing any of the functionality/operations of the present invention.

Computer system 01 includes a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices.

Computer system/server 12 may be described in the general context of computer system-executable instructions, such as program modules, being executed by a computer system. Generally, program modules may include routines, programs, objects, components, logic, and/or data structures that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 5, computer system/server 12 in computer system 01 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions/operations of embodiments of the invention.

Program/utility 40, having a set (at least one) of program modules 42, may be stored in memory 28 by way of example, and not limitation. Exemplary program modules 42 may include an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the present invention.

Computer system/server 12 may also communicate with one or more external devices 14 such as a keyboard, a pointing device, a display 24, one or more devices that enable a user to interact with computer system/server 12, and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components may be used in conjunction with computer system/server 12. Examples, include, but are not limited to: microcode, device drivers, redundant processing units, external disk drive arrays, RAID systems, tape drives, and data archival storage systems.

Cloud Computing

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 6:
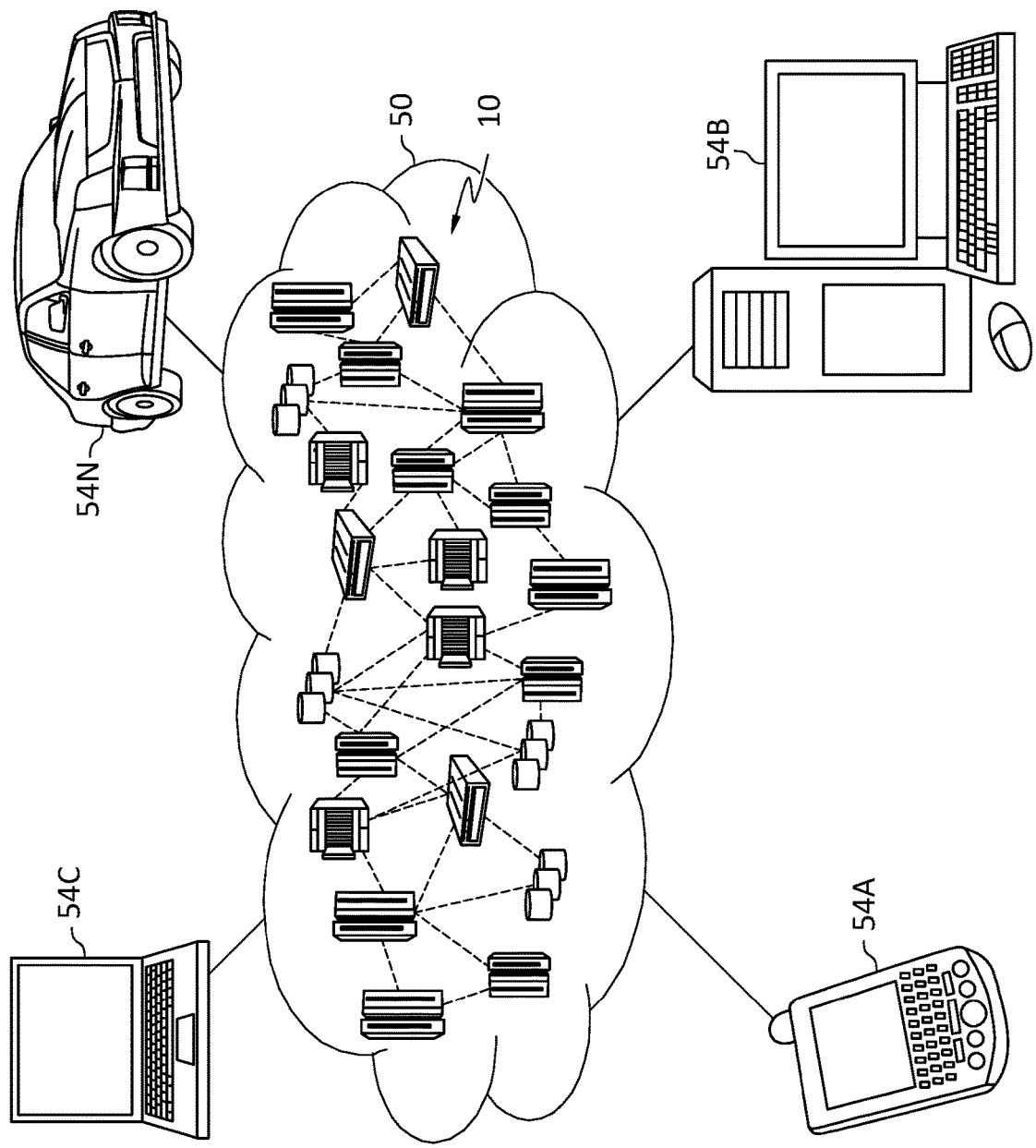
FIG. 6 depicts a cloud computing environment according to various embodiments of the present invention.

Referring now to FIG. 6, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 6 are intended to be illustrative only and that computing nodes 10 and cloud computing environment 50 can communicate with any type of computerized device over any type of network and/or network addressable connection (e.g., using a web browser).

Figure 7:
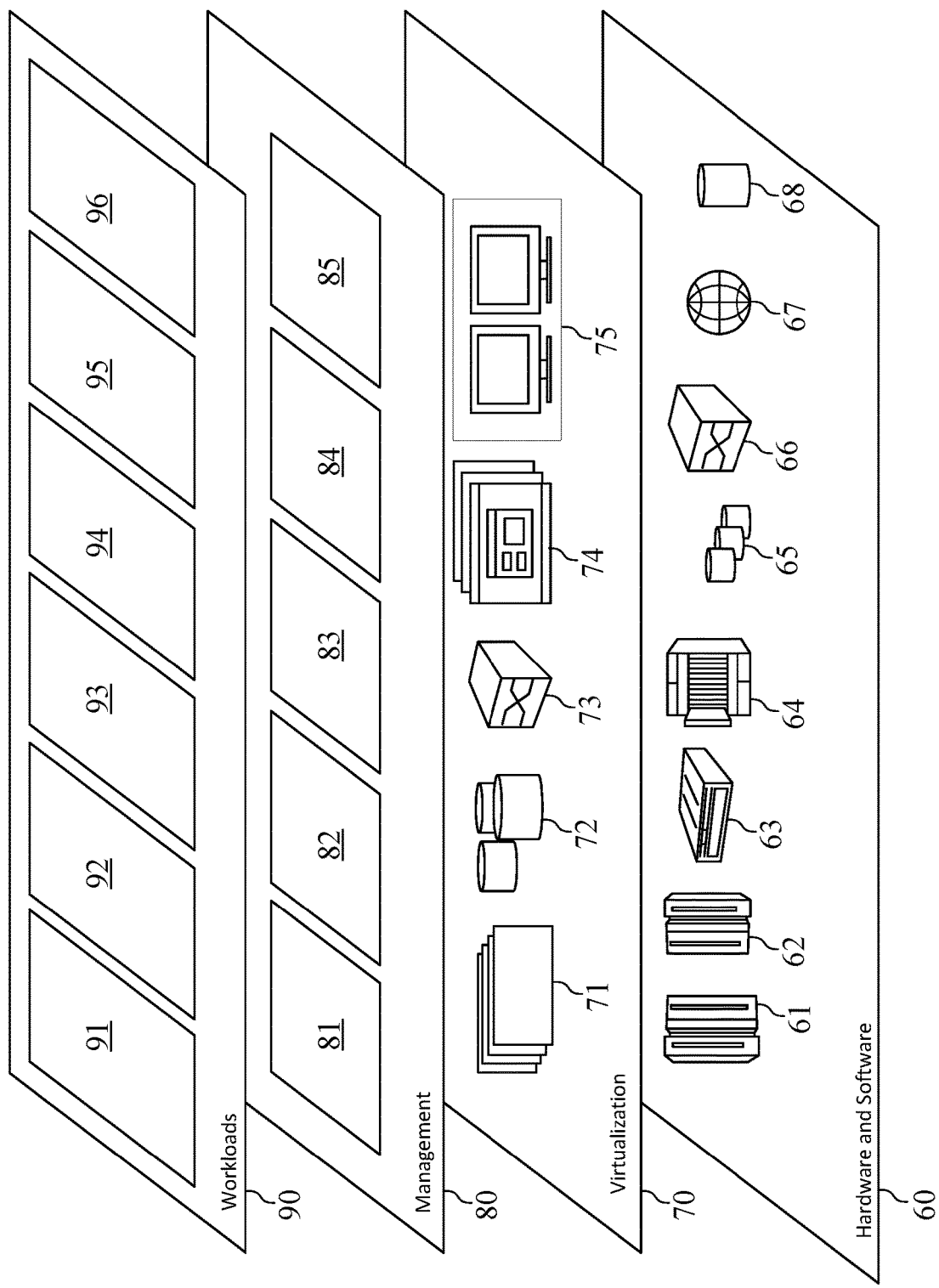
FIG. 7 depicts abstraction model layers according to various embodiments of the present invention.

Referring now to FIG. 7, a set of functional abstraction layers provided by cloud computing environment 50 (FIG. 6) is shown. It should be understood in advance that the components, layers, and functions shown in FIG. 7 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and predictive neural networks 96.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method comprising:
    dispersing a first quantity of graphene oxide in a fluid to form a cleaning fluid;
    washing a first electronic part with the cleaning fluid;
    testing the cleaning fluid for a concentration of ions; and
    determining the ion concentration is above a threshold.

2. The method of claim 1 further comprising:
    replacing the cleaning fluid based on determining that the ion concentration is not below the threshold.

3. The method of claim 2 wherein the replacing comprises:
    replacing all the cleaning fluid.

4. The method of claim 2 wherein the replacing comprises:
    calculating a portion of the cleaning fluid that will need to be replaced to bring the ion concentration below the threshold; and
    replacing the portion of the cleaning fluid to bring the ion concentration of the cleaning fluid below a predetermined level.

5. The method of claim 1 further comprising:
    washing a second part with the fluid; and
    testing the fluid for a concentration of ions a second time.

6. The method of claim 1, wherein the washing comprises high pressure washing and
    scrubbing.

7. The method of claim 1, wherein the fluid is water.

8. The method of claim 1, wherein the graphene oxide is in powder form.

9. The method of claim 1, further comprising:
    adjusting, following the dispersion, the fluid to have a potential hydrogen of approximately 7.

10. The method of claim 1, further comprising:
    dispersing a second quantity of graphene oxide in deionized water (DI) to form a DI fluid; and
    cleaning the part with the DI fluid.

* * * * *